United States Patent
Song et al.

(10) Patent No.: US 7,250,831 B2
(45) Date of Patent: Jul. 31, 2007

(54) FILTER COMPRISING INDUCTOR, DUPLEXER USING THE FILTER AND FABRICATING METHODS THEREOF

(75) Inventors: In-sang Song, Seoul (KR); Byeoung-ju Ha, Yongin-si (KR); Yun-kwon Park, Dongducheon-si (KR); Jong-seok Kim, Hwasung-si (KR); Duck-hwan Kim, Goyang-si (KR); Kuang-woo Nam, Seoul (KR); Hae-seok Park, Yongin-si (KR); Seog-woo Hong, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 143 days.

(21) Appl. No.: 11/130,156

(22) Filed: May 17, 2005

(65) Prior Publication Data
US 2005/0253668 A1    Nov. 17, 2005

(30) Foreign Application Priority Data
May 17, 2004    (KR) ............. 10-2004-0034970

(51) Int. Cl.
*H03H 9/70* (2006.01)
*H03H 9/54* (2006.01)

(52) U.S. Cl. ............... 333/133; 333/189; 216/17; 29/25.35

(58) Field of Classification Search ............. 333/133, 333/189
See application file for complete search history.

(56) References Cited

U.S. PATENT DOCUMENTS
6,407,649 B1 *    6/2002   Tikka et al. ............. 333/133

(Continued)

FOREIGN PATENT DOCUMENTS
JP    2002-314372 A    10/2002

(Continued)

OTHER PUBLICATIONS

Seabury, C.W. et al.; "Thin Film ZnO Based Bulk Acoustic Mode Filters"; 1997 IEEE International Microwave Sumposium Digest, vol. 1, pp. 181-184, Jun. 8-13, 1997.*

*Primary Examiner*—Barbara Summons
(74) *Attorney, Agent, or Firm*—Sughrue Mion, PLLC

(57) ABSTRACT

A filter using an air gap type film bulk acoustic resonator is provided. The present filter includes a substrate on which a first port, a second port, and a ground port are formed to be connected to an external terminal; at least one first film bulk acoustic resonator serially connecting the first port to the second port on the substrate; at least one second film bulk acoustic resonator parallel connected to an interconnection node formed between the first port and the second port; and at least one inductor serially connecting the second film bulk acoustic resonator to the ground port. The inductor included in the filter is fabricated with the first and second film bulk acoustic resonators as one body. Accordingly, a small-sized filter may be fabricated through a simplified process.

9 Claims, 5 Drawing Sheets

U.S. PATENT DOCUMENTS

| | | |
|---|---|---|
| 6,670,866 B2 * | 12/2003 | Ella et al. .................... 333/133 |
| 6,710,681 B2 | 3/2004 | Figueredo et al. |
| 6,768,396 B2 * | 7/2004 | Klee et al. .................. 333/187 |
| 6,885,260 B2 * | 4/2005 | Nishimura et al. ......... 333/133 |
| 6,911,708 B2 * | 6/2005 | Park ........................... 257/416 |
| 6,927,649 B2 * | 8/2005 | Metzger et al. ............. 333/133 |
| 7,042,312 B2 * | 5/2006 | Sul et al. .................... 333/187 |
| 7,138,888 B2 * | 11/2006 | Yamakawa et al. ......... 333/133 |
| 2003/0205948 A1 * | 11/2003 | Lin et al. .................... 310/312 |
| 2004/0130410 A1 * | 7/2004 | Nishimura et al. ......... 333/133 |
| 2005/0134401 A1 * | 6/2005 | Song et al. ................. 333/133 |
| 2005/0140468 A1 * | 6/2005 | Wang ......................... 333/191 |
| 2006/0139121 A1 * | 6/2006 | Jhung ......................... 333/133 |
| 2006/0244552 A1 * | 11/2006 | Park et al. .................. 333/189 |

FOREIGN PATENT DOCUMENTS

WO    WO 02/093763    * 11/2002

* cited by examiner

FILTER COMPRISING INDUCTOR, DUPLEXER USING THE FILTER AND FABRICATING METHODS THEREOF

CROSS-REFERENCE TO RELATED APPLICATIONS

This application claims benefit under 35 U.S.C. § 119 from Korean Patent Application No. 2004-34970 filed on May 17, 2004 in the Korean Intellectual Property Office, the entire content of which is incorporated herein by reference.

BACKGROUND OF THE INVENTION

1. Field of the Invention

The present invention relates generally to a filter using a film bulk acoustic resonator (hereinafter, it will be referred to as "FBAR"), a duplexer using the filter, and fabrication methods thereof. More particularly, the present invention relates to a filter which is fabricated by combining inductors for adjusting resonance characteristics with FBARs as a single chip in a serial and parallel manner, a duplexer using the filter, and fabrication methods thereof.

2. Description of the Related Art

In recent years, demand for mobile communication devices such as cellular phones is rapidly increasing, so that demand for a small-sized and light-weight filter and a duplexer used in such mobile communication devices is also increasing. In the meantime, the FBAR is known to be suitable for a small and light-weight filter. The FBAR has advantages in that it allows mass production at a minimum cost and allows the minimum size implementation. In addition, it has advantages in that it may implement a high quality factor Q which is a main characteristic of the filter, it may be utilized in a microwave band, and in particular it may also be utilized in a personal communication system (PCS) band and a digital cordless system (DCS) band.

In general, the FBAR device includes a resonant portion on a substrate where a bottom electrode, a piezoelectric layer, and a top electrode are sequentially stacked. The operating principle of the FBAR is as follows. Electrical energy is applied to the electrode to induce a time-varying magnetic field within the piezoelectric layer, and the magnetic field induces a bulk acoustic wave in the same direction as the vibration direction of the resonant portion within the piezoelectric layer to thereby generate a resonance.

A ladder type filter is one type of filter that uses the FBAR device. The ladder type filter is a band pass filter, wherein a plurality of FBAR devices is combined in a serial and parallel manner to adjust resonance characteristics of each device to thereby pass only signals within a predetermined frequency band.

FIG. 1 is a block diagram illustrating a ladder type filter where a plurality of thin film resonators (TFRs) is combined in a serial and parallel manner as disclosed in U.S. Pat. No. 6,377,136. Referring to FIG. 1, the filter includes a plurality of serial TFRs S1, S2, . . . , SN, and a plurality of parallel TFRs P1, P2, . . . , Pn. Each of the serial TFRs 11, 12, . . . , N is serially connected to each other between an input port and an output port. Each of the parallel TFRs 21, 22, . . . , n connects the ground to each node between two adjacent serial TFRs 11, 12, . . . , N.

FIG. 2 is a graph illustrating impedance characteristics of serial and parallel TFRs included in the ladder type filter. Referring to FIG. 2, f1 and f2 of the impedance characteristic graph 30 of the serial TFR indicate antiresonance frequency and resonance frequency, respectively, and f3 and f4 of the impedance characteristic graph 40 of the parallel TFR indicate antiresonance frequency and resonance frequency, respectively. When the frequency characteristic of the parallel TFR or the serial TFR is adjusted so as to match the antiresonance frequency f3 of the parallel TFR with the resonance frequency f2 of the serial TFR, only signals within the frequency band ranging from f1 to f4 are passed, which is the operation of the band pass filter. In this case, the resonance frequency of the band pass filter is f2 which is equal to f3.

In order to adjust the frequency characteristic of the serial TFR or the parallel TFR in the filter shown in FIG. 1, thickness and material for electrode, piezoelectric layer or the like which compose each of the TFRs should be fabricated to be different from one another. As a result, there occurs a difficulty in having fabrication processes different from one another per each of TFRs.

Alternatively, the frequency characteristic of the band pass filter may be adjusted by properly combining the TFRs having uniform frequency characteristics and connecting devices such as inductors to the parallel TFR. However, the connection of an external device such as inductor causes the device volume to be increased. As a result, it is difficult to apply it to a small-sized communication apparatus such as a cellular phone.

Such a filter may be employed in a device such as a duplexer. The duplexer is a device for transceiving signals through one antenna, and has a structure including a transmitting port filter, a receiving port filter, and a filter isolating portion for preventing signal interference between the filters. The transmitting port filter filters only signals to be transmitted outward through the antenna, and the receiving port filter filters only signals to be received from outside the duplexer. The filter isolating portion may be implemented as a phase shifter which serves to prevent interference between the filters by having a phase difference of 90° between the frequency of the transmitting signal and that of the receiving signal. The phase shifter may be implemented typically using a capacitor and an inductor.

The duplexer also uses the filter, which in turn causes the size of the duplexer to be increased in response to the increased size of the fabricated filter. In addition, when the filter fabrication process becomes complicated, it becomes more difficult to fabricate the duplexer.

SUMMARY OF THE INVENTION

It is therefore one aspect of the present invention to provide a filter which may be implemented as a small-sized filter by fabricating inductors and FBARs as one body through a simplified fabrication process, a duplexer using the filter, and fabrication methods thereof.

According to one aspect of the present invention, there is provided a filter, which includes a substrate on which a first port, a second port, and a ground port are formed to be connected to an external terminal; at least one first film bulk acoustic resonator serially connecting the first port to the second port on the substrate; at least one second film bulk acoustic resonator parallel connected to an interconnection node formed between the first port and the second port; and at least one inductor serially connecting the second film bulk acoustic resonator to the ground port.

In this case, at least one of the first and second film bulk acoustic resonators preferably, but not necessarily, includes a cavity formed in a predetermined region of the substrate; and a resonant portion composed of a first electrode, a piezoelectric layer, and a second electrode which are sequentially stacked in an upper space spaced from a bottom surface of the cavity by a predetermined distance.

Alternatively, the inductor more preferably, but not necessarily, includes a piezoelectric layer stacked on an upper surface of the substrate except the region where the empty region is formed; a metal layer stacked on the top surface of the piezoelectric layer as a predetermined coil shape; and an interconnection line for electrically connecting the metal layer to the second film bulk acoustic resonator.

According to another aspect of the present invention, there is provided a duplexer, which includes a first filter having at least one first inductor and filtering a signal within a predetermined receiving frequency band tuned by the first inductor; a second filter having at least one second inductor and filtering a signal within a predetermined receiving frequency band tuned by the second inductor; and a filter isolating portion formed between the first filter and the second filter to prevent a signal from flowing between the first filter and the second filter.

Preferably, but not necessarily, the duplexer may further include a substrate where a first port, a second port, and a third port are formed to be electrically connected to an external terminal. Accordingly, the second port and the third port are preferably connected to the first filter and the second filter, respectively, and the first port is preferably connected to the first filter and the filter isolating portion, and the filter isolating portion is preferably connected between the first port and the second filter.

Preferably, but not necessarily, at least one of the first filter and the second filter may include at least one first film bulk acoustic resonator serially connecting a predetermined input port to a predetermined output port; at least one second film bulk acoustic resonator parallel connected to an interconnection node formed between the input port and the output port; and at least one inductor serially connecting the second film bulk acoustic resonator to a predetermined ground port.

In addition, the inductor may preferably, but not necessarily, include a piezoelectric layer stacked on an upper surface of the substrate except the region where the empty region is formed; a metal layer stacked on the top surface of the piezoelectric layer as a predetermined coil shape; and an interconnection line for electrically connecting the metal layer to the second film bulk acoustic resonator.

The filter isolating portion may be implemented to have at least one capacitor combined with a coil, and may cause a frequency phase difference of signals filtered in the first and second filters of 90°.

According to another aspect of the present invention, there is provided a method for fabricating a filter, which includes (a) stacking a predetermined insulating layer on a top surface of a substrate; (b) depositing a first metal layer on the insulating layer and patterning it to form a plurality of first electrodes; (c) stacking a piezoelectric layer on top surfaces of the plurality of the first electrodes and the insulating layer; (d) depositing a second metal layer on the piezoelectric layer and patterning it to form a plurality of second electrodes and a predetermined coil-shaped inductor; and (e) etching the substrate below the region where the first electrode, the piezoelectric layer, and the second electrode are sequentially stacked to form an air gap to form a plurality of resultant film bulk acoustic resonators.

In this case, the (e) step of etching the substrate preferably, but not necessarily, includes forming at least one via hole penetrating a predetermined region of a lower portion of the substrate; using the via hole to etch the substrate below the region; and bonding a predetermined packaging substrate to the substrate to shield the via hole.

BRIEF DESCRIPTION OF THE DRAWINGS

The above aspects and features of the present invention will be more apparent by describing certain embodiments of the present invention with reference to the accompanying drawings, in which.

DETAILED DESCRIPTION OF EXEMPLARY EMBODIMENTS

Hereinafter, the present invention will be described in detail with reference to illustrative accompanying drawings.

Figure 1:
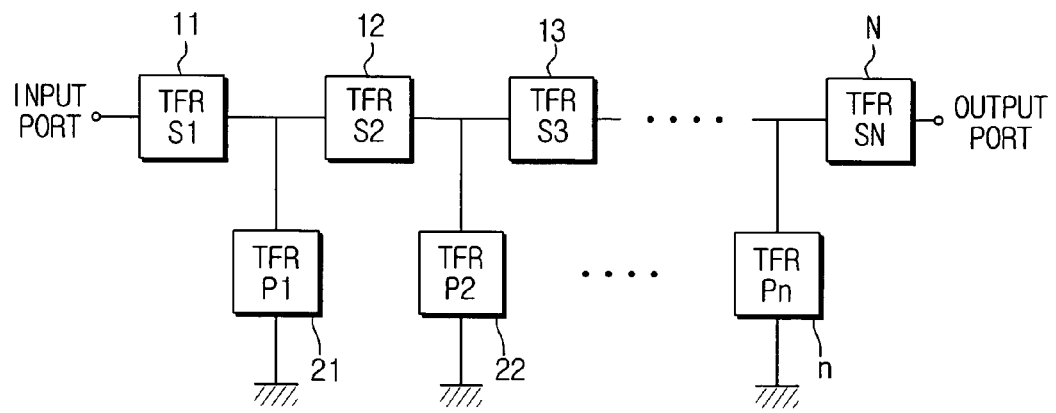
FIG. 1 is a block diagram illustrating a ladder type filter fabricated by combining FBARs in the related art.
Figure 2:
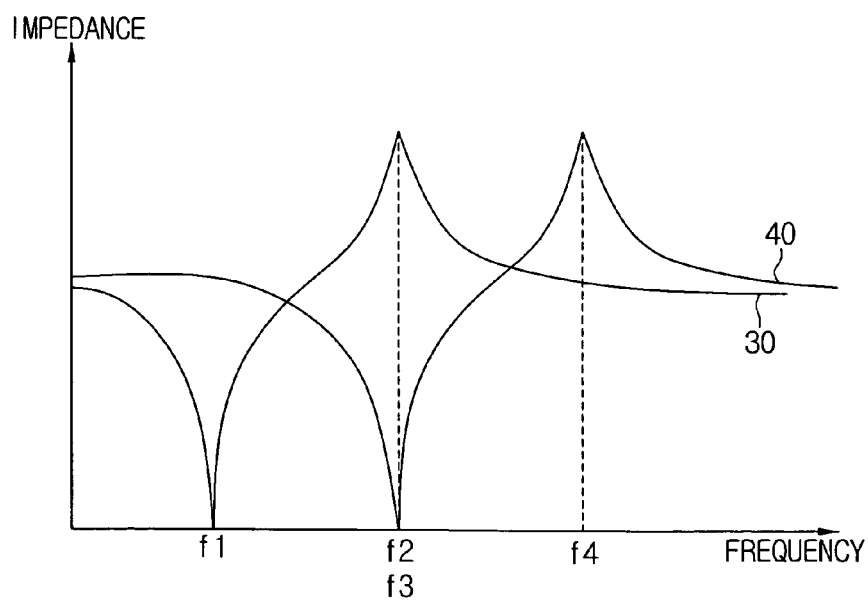
FIG. 2 is a graph illustrating impedance characteristics of FBARs composing a ladder type filter.
Figure 3:
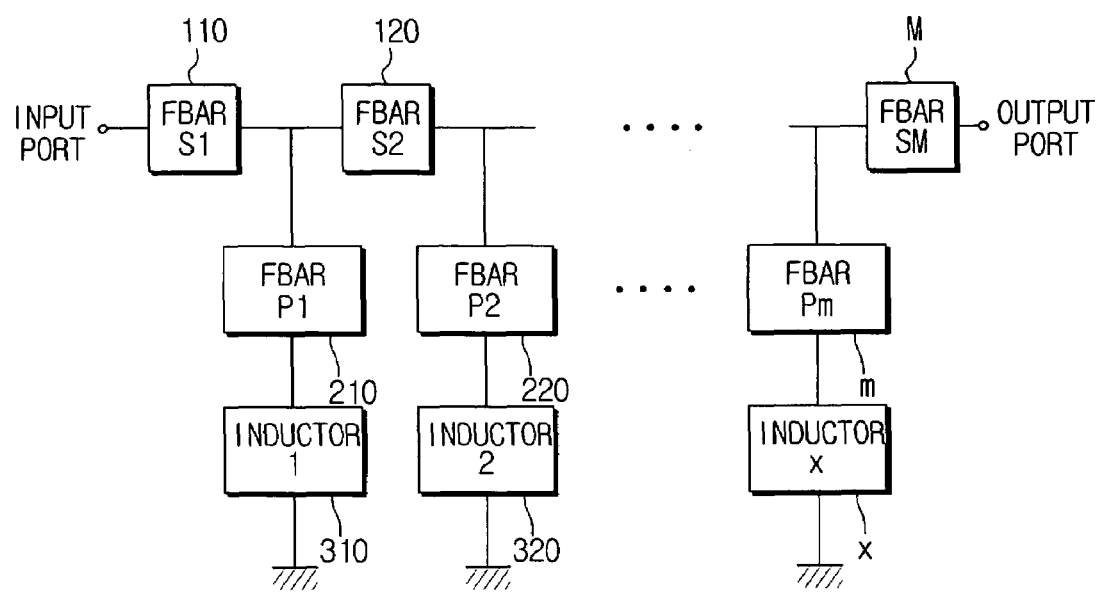
FIG. 3 is a block diagram illustrating a filter in accordance with one embodiment of the present invention.

FIG. 3 is a block diagram of a filter which is combined with a plurality of film bulk acoustic resonators (FBARs) in accordance with one embodiment of the present invention. Referring to FIG. 3, the filter includes a plurality of serial FBARs 110, 120, . . . , M such as FBAR S1, S2, . . . , SM, a plurality of parallel FBARs 210, 220, . . . , m such as FBAR P1, P2, . . . , Pm, and inductors 310, 320, . . . , x serially connected between the parallel FBARs 210, 220, . . . , m and the ground, respectively. As mentioned previously, the plurality of FBARs is combined in a serial and parallel manner to be implemented as a ladder type filter. Accordingly, it operates as a band pass filter which filters only signals within a predetermined frequency band as shown in FIG. 2.

An air gap type FBAR may be employed for the serial and parallel FBARs, which includes a resonant portion where a bottom electrode, a piezoelectric layer, and a top electrode are sequentially stacked on a substrate, and an air gap positioned below the resonant portion.

Inductors 310, 320, . . . , x are fabricated such that metal materials are stacked on the substrate as circular or rectangular shapes. Serial FBARs 110, 120, . . . M, parallel FBARs 210, 220, . . . , m, and inductors 310, 320, . . . x are fabricated on one substrate as a single chip, which is the filter shown in FIG. 3. Accordingly, the fabrication process for each FBAR may still be used to implement the inductor. That is, the inductor may be fabricated by patterning the top electrode or the bottom electrode as a predetermined coil shape during the deposition and patterning of the top electrode or the bottom electrode. In addition, a piezoelectric layer may be used as an insulating layer for insulating the inductor from the substrate. As shown in FIG. 3, the parallel FBARs 210, 220, . . . , m may be serially connected to the inductors having predetermined inductances, respectively to adjust the frequency characteristics of the parallel FBARs. Accordingly, the material, the thickness or the like of each FBAR does not need to be considered so that they may be different from one another when each FBAR is to be fabricated.

Figure 4:
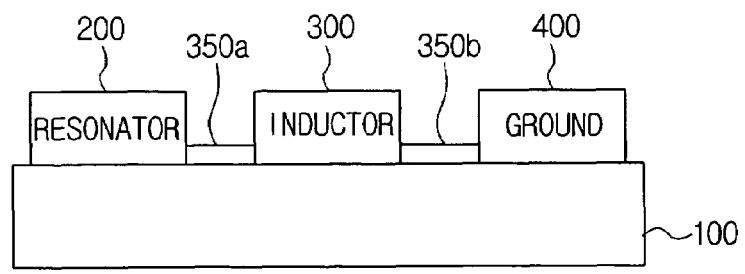
FIG. 4 is a schematic diagram illustrating a FBAR and an inductor composing the filter shown FIG. 3.

FIG. 4 is a cross-sectional diagram illustrating a portion where an inductor 300 connects one parallel FBAR 200 to a ground 400. The inductor 300 is fabricated on the same substrate as the parallel FBAR 200 to be implemented on a single chip. The inductor 300 connects the parallel FBAR 200 to the ground 400 through interconnection lines 350a and 350b formed of a predetermined metal.

Figure 5:
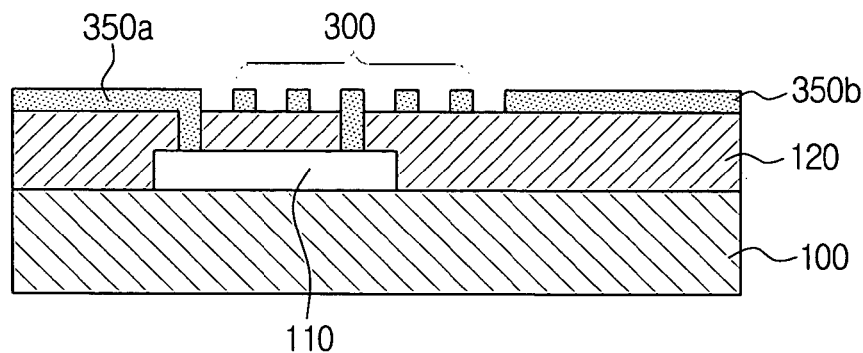
FIG. 5 is a cross-sectional diagram illustrating a detailed structure of the inductor shown in FIG. 4.

FIG. 5 is a cross-sectional diagram for explaining a detailed structure of the inductor 300 shown in FIG. 4. Referring to FIG. 5, a predetermined-shaped metal line 110 is stacked on a top surface of a substrate 100, and a piezoelectric layer 120 is stacked on the top surface of the substrate 100 and includes the metal line 110. A predetermined-shaped metal layer 300 is stacked on the piezoelectric layer 120 to form the inductor 300 and the interconnection lines 350a and 350b. In this case, a portion of the metal layers 300 which are stacked as a coil shape serves to act as the inductor 300. The metal layer 300 also forms the interconnection lines 350 on the piezoelectric layer 120 which are connected to the external ground 400. One interconnection line 350a of the interconnection lines is electrically connected to the inductor 300 through the metal line 110 below the one interconnection line. As a result, an external device, namely, the parallel FBAR 200, is electrically connected to the inductor 300. The other interconnection line 350b is connected to the ground 400. As shown in FIG. 5, the inductor 300 is serially connected to the parallel FBAR 200, so that an inductance (L) of the parallel FBAR 200 is increased by an amount of the natural inductance of the inductor 300. The natural inductance of the inductor 300 may be adjusted in response to the coil length, shape or the like, so that the frequency characteristic of the filter itself may be readily adjusted.

There is no air gap below the inductor 300 in FIG. 5. However, a predetermined region of the substrate may be etched in order to isolate it from the substrate to thereby form the air gap. In this case, the air gap may be fabricated by fabricating a via hole in a lower portion of the substrate and injecting an etching solution or an etching gas through the via hole. The inductor 300 is connected to the parallel FBAR 200 in FIG. 5, but there is a possibility of connecting the inductor to the serial FBAR when the filter is to be designed.

FIGS. 6A to 6E are cross-sectional diagrams for explaining a process of fabricating the filter shown in FIG. 3. As mentioned previously, a plurality of serial FBARs and a plurality of parallel FBARs are required to compose one filter, however, FIGS. 6A to 6E are cross-sectional diagrams illustrating one FBAR and an inductor for simplicity of description.

Figure 6A:
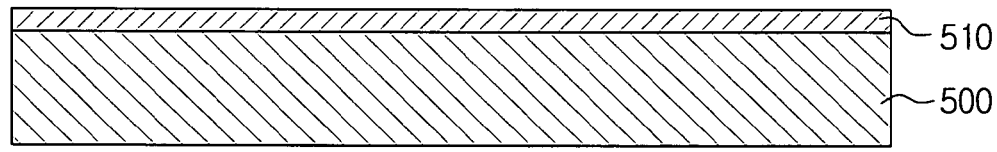
FIGS. 6A to 6E are cross-sectional diagrams for explaining a process of fabricating the filter shown in FIG. 3.

Referring to FIG. 6A, an insulating layer 510 is first deposited on a top surface of a substrate 500. The insulating layer 510 serves to electrically isolate a metal portion from the substrate 500. Insulating materials such as SiO2 or Al2O2 may be employed for the material forming the insulating layer 510. A method for depositing the insulating layer 510 on the substrate 50 may include an RF magnetron sputtering method, an evaporation method or the like.

Figure 6B:
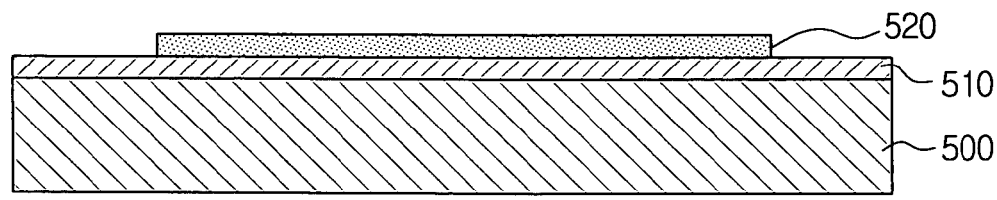

Next, as shown in FIG. 6B, a first electrode 520 is deposited on the insulating layer 510 and patterned to expose a predetermined region of the insulating layer 510. The first electrode 520 is formed using a typical conductive material such as a metal. In particular, Al, W, Au, Pt, Ni, Ti, Cr, Pd, Mo or the like may be employed for the metal.

Figure 6C:
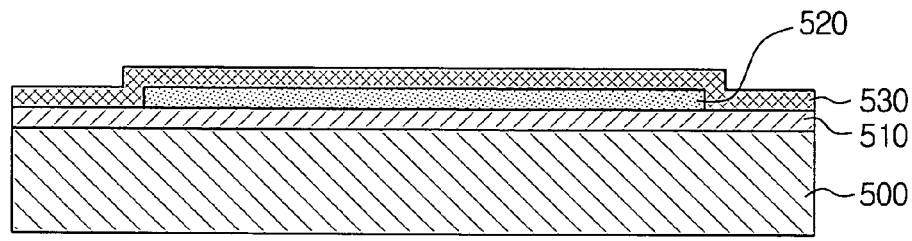

A piezoelectric layer 530 is deposited on the top surfaces of the exposed insulating layer 510 and the first electrode 520 as shown in FIG. 6C. The piezoelectric layer 530 serves to generate a piezoelectric effect which converts electrical energy to mechanical energy such as an elastic wave as mentioned previously. AlN, ZnO or the like may be employed for forming the piezoelectric layer 530.

Figure 6D:
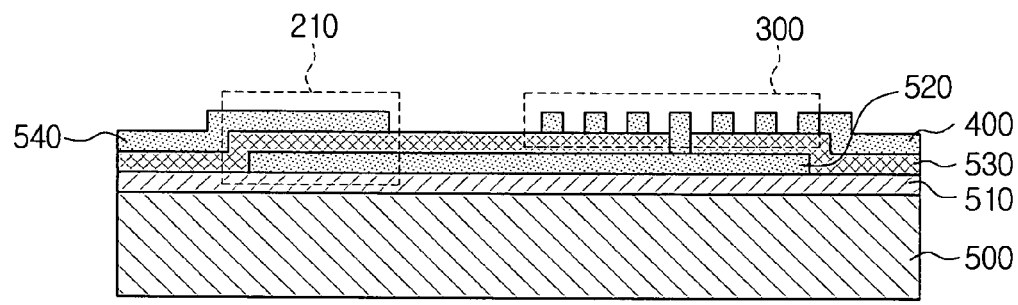

As shown in FIG. 6D, a second electrode 540 is deposited and patterned on the piezoelectric layer 530. In this case, along with the first electrode 520 and the piezoelectric layer 530, the second electrode 540 remaining on the piezoelectric layer 530 having the first electrode 520 positioned below the piezoelectric layer, forms a resonant portion 210. The second electrode 540 may remain on the piezoelectric layer 530 other than the portion where the resonant portion 210 is formed to thereby implement the inductor 300. The first electrode 520 serves to electrically connect the resonant portion 210 to the inductor 300. The interconnection line 350 to be connected to the ground may be implemented using the second electrode 540.

Figure 6E:
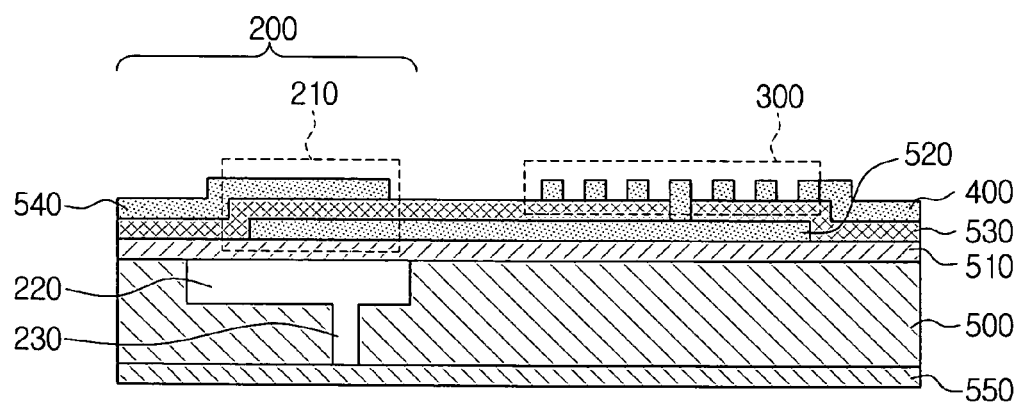

As shown in FIG. 6E, the substrate below the resonant portion 210 may be etched to form the air gap 220. In this case, a via hole 230 which penetrates the upper portion or the lower portion of the substrate 500 may be formed in order to form the air gap 220. A packaging substrate 550 may be separately bonded in order to prevent contaminants from being introduced through the via hole 230 when the via hole is formed in the lower portion of the substrate 500. The bonding method may include a direct bonding method utilizing heating, an anodic bonding method utilizing a voltage, a bonding method utilizing an adhesive such as an epoxy, a eutectic bonding method utilizing a metal or the like. However, the bonding method utilizing the adhesive and the eutectic bonding method which are to be subjected to a low temperature step are preferably employed instead of the direct bonding method and the anodic bonding method which are subjected to a relatively high temperature step.

Forming the air gap 220 leads to a final fabrication of the air gap type FBAR 200. Alternatively, it is also possible to etch the substrate region below the inductor 300 to thereby form the air gap.

Figure 7:
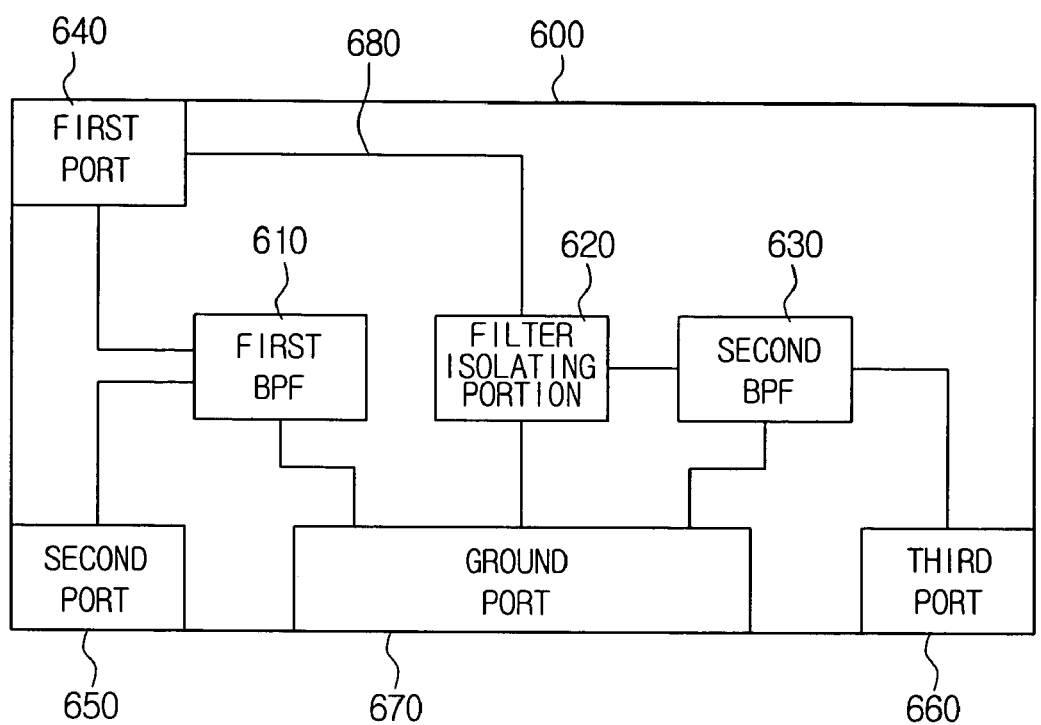
FIG. 7 is a block diagram illustrating a duplexer using a filter in accordance with one embodiment of the present invention.

FIG. 7 is a block diagram of a duplexer 600 fabricated using the filter shown in FIG. 3 in accordance with one embodiment of the present invention. As mentioned previously, the duplexer is a representative device which uses a band pass filter (hereinafter, it will be referred to as BPF). Referring to FIG. 7, the duplexer according to one embodiment of the present invention includes a first BPF 610, a filter isolating portion 620, a second BPF 630, a first port 640, a second port 650, a third port 660, and a ground port 670.

A filter implemented by combining a plurality of air gap type FBARs in a serial and parallel manner may be employed as each of the first and second BPF 610 and 630. Each filter may use a single chip filter formed on one substrate where the inductor is also formed to be included on the substrate.

Each of the first to third ports 640, 650, and 660 may be electrically connected to an external device, and are formed of a conductive material. Each port is connected to one or more of the first and second BPFs 610 and 630 and the filter isolating portion 620 by means of the interconnection line 680 formed of a predetermined metal material.

The ground port 670 shown in FIG. 7 means the portion which is electrically connected to an external ground terminal.

Referring to FIG. 7, the first port 640 serves to connect an external antenna (not shown) to the first BPF 610 and the filter isolating portion 620. When the first BPF 610 is a receiving port filter and the second BPF 630 is a transmitting port filter, incoming signals are not applied to the second BPF 630 but are applied to the first BPF 610 because of the filter isolating portion 620.

The filter isolating portion 620 may be implemented as the phase shifter combined with an inductor and capacitor as mentioned previously. The phase shifter causes the frequency phase difference between the receiving signal and the transmitting signal to be 90° to isolate the transmitting port filter from the receiving port filter.

Each of the ports 640, 650, 660, 670, the interconnection line 680, the filter isolating portion 620 or the like may be fabricated together on one substrate using the fabrication process for the first and second BPFs 610 and 630. The same fabrication process as that shown in FIGS. 6A to 6E may be employed. That is, after the insulating layer 510 is deposited on the top surface of the single substrate 500, the first electrode 520, the piezoelectric layer 530, and the second electrode 540 are concurrently stacked on the first BPF 610, the filter isolating portion 620, and the second BPF 630 in predetermined shapes, respectively. Each of the first BPF 610 and the second BPF 630 has the inductor 300 inside, respectively, so that each frequency characteristic is adjusted by the inductor 300. Accordingly, for each of FBARs composing the first BPF 610 and the second BPF 630, the electrode thickness or the like does not need to be adjusted, which leads to a simplified fabrication process and the decreased device volume because of the built-in inductor 300.

As mentioned above, in the filter according to an embodiment of the present invention, a plurality of FBARs and inductors are formed on one substrate. Accordingly, a burdensome process may be avoided where each FBAR undergoes a different process for adjusting the frequency characteristic when the filter is fabricated. In addition, the inductors and the FBARs may be fabricated on one substrate so that the device may be small. Furthermore, a duplexer using the present filter may be fabricated. In this case, the filter having the built-in inductor and the filter isolating portion may be fabricated at the same time, so that a process of fabricating the duplexer may be simplified and the duplexer may be fabricated to be small.

The foregoing embodiment and advantages are merely exemplary and are not to be construed as limiting the present invention. The present teaching can be readily applied to other types of apparatuses. Also, the description of the embodiments of the present invention is intended to be illustrative, and not to limit the scope of the claims, and many alternatives, modifications, and variations will be apparent to those skilled in the art.

What is claimed is:

1. A filter comprising:
   a substrate on which a first port, a second port, and a ground port are formed to be connected to an external terminal;
   at least one first film bulk acoustic resonator serially connecting the first port to the second port on the substrate;
   at least one second film bulk acoustic resonator parallel connected to an interconnection node formed between the first port and the second port;
   at least one inductor serially connecting the second film bulk acoustic resonator to the ground port;
   at least one via hole penetrating a predetermined region of a lower portion of the substrate, wherein the at least one via hole is used to etch the substrate below the predetermined region; and
   a predetermined packaging substrate bonded to the substrate to shield the via hole.

2. The filter as recited in claim 1, wherein at least one of the first and second film bulk acoustic resonators includes:
   a cavity formed in the predetermined region of the substrate; and
   a resonant portion comprising a first electrode, a piezoelectric layer, and a second electrode, which are sequentially stacked in an upper space spaced from a bottom surface of the cavity by a predetermined distance.

3. The filter as recited in claim 2, wherein the inductor comprises:
   a piezoelectric layer stacked on an upper surface of the substrate away from the predetermined region where the cavity region is formed;
   a metal layer stacked on the top surface of the piezoelectric layer as a predetermined coil shape; and
   an interconnection line for electrically connecting the metal layer to the second film bulk acoustic resonator.

4. A duplexer comprising:
   a first filter having at least one first inductor and filtering a signal within a predetermined receiving frequency band tuned by the first inductor;
   a second filter having at least one second inductor and filtering a signal within a predetermined receiving frequency band tuned by the second inductor; and
   a filter isolating portion formed between the first filter and the second filter to prevent a signal from flowing between the first filter and the second filter,
   a substrate which is etched by forming at least one via hole which penetrates a predetermined region of a lower portion of the substrate;
   using the via hole to etch the substrate below the predetermined region; and
   bonding a predetermined packaging substrate to the substrate to shield the via hole.

5. The duplexer as recited in claim 4, wherein a first port, a second port, and a third port are formed to be electrically connected to an external terminal,
   wherein the second port and the third port are connected to the first filter and the second filter, respectively, and the first port is connected to the first filter and the filter isolating portion, and the filter isolating portion is connected between the first port and the second filter.

6. The duplexer as recited in claim 4, wherein at least one of the first filter and the second filter comprises:
   at least one first film bulk acoustic resonator serially connecting a predetermined input port to a predetermined output port;
   at least one second film bulk acoustic resonator parallel connected to an interconnection node formed between the input port and the output port; and
   at least one inductor serially connecting the second film bulk acoustic resonator to a predetermined ground port.

7. The duplexer as recited in claim 6, wherein the inductor comprises:
   a piezoelectric layer stacked on an upper surface of the substrate region;
   a metal layer stacked on the top surface of the piezoelectric layer as a predetermined coil shape; and
   an interconnection line for electrically connecting the metal layer to the second film bulk acoustic resonator.

8. The duplexer as recited in claim 7, wherein the filter isolating portion is implemented to have at least one capacitor combined with a coil, and makes a frequency phase difference of signals filtered in the first and second filters to be 90°.

9. A method for fabricating a filter comprising:
(a) stacking a predetermined insulating layer on a top surface of a substrate;
(b) depositing a first metal layer on the insulating layer and patterning the first metal layer to form a plurality of first electrodes;
(c) stacking a piezoelectric layer on top surfaces of the plurality of the first electrodes and the insulating layer;
(d) depositing a second metal layer on the piezoelectric layer and patterning the second metal layer to form a plurality of second electrodes and a predetermined coil-shaped inductor; and
(e) etching the substrate below respective regions where a respective one of the plurality of the first electrodes, the piezoelectric layer, and a respective one of the plurality of the second electrodes are sequentially stacked to form an air gap to form a plurality of resultant film bulk acoustic resonators, wherein the etching of the substrate comprises:

forming at least one via hole penetrating a predetermined region of a lower portion of the substrate;

using the via hole to etch the substrate below the predetermined region; and bonding a predetermined packaging substrate to the substrate to shield the via hole.

* * * * *